(12) United States Patent
Marsella et al.

(10) Patent No.: US 6,238,849 B1
(45) Date of Patent: May 29, 2001

(54) CYCLIC UREAS IN PHOTORESIST DEVELOPERS

(75) Inventors: John Anthony Marsella, Allentown; Kevin Rodney Lassila, Macungie, both of PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/481,063

(22) Filed: Jan. 11, 2000

Related U.S. Application Data

(63) Continuation-in-part of application No. 09/337,053, filed on Jun. 21, 1999.

(51) Int. Cl.$^7$ ........................................... G03C 5/30
(52) U.S. Cl. ..................... 430/331; 430/329; 510/176
(58) Field of Search .................... 430/331, 329; 510/176

(56) References Cited

U.S. PATENT DOCUMENTS

| | | | |
|---|---|---|---|
| 4,997,748 | 3/1991 | Takeda et al. | 430/331 |
| 5,300,143 | * 4/1994 | Schwarz | 106/22 |
| 5,972,431 | 10/1999 | Marsella et al. | 427/382 |
| 5,985,968 | 11/1999 | Lassila | 524/211 |

FOREIGN PATENT DOCUMENTS 03062034   3/1991   (JP).

OTHER PUBLICATIONS

Microlithography, Science and Technology, edited by J. R. Sheats and B. W. Smith, Marcel Dekker, Inc. 1998, pp 551–553.

Maekawa et al. "Dissolution Inhibitory Effect of Urea Additives on a Carboxyl Polymer Through a Supramolecular Structure", Journal of Polymer Science and Technolgy, vol. 11, 3 (1998) pp 533–536.

* cited by examiner

Primary Examiner—Paul R. Michl
(74) Attorney, Agent, or Firm—Michael Leach

(57) ABSTRACT

This invention provides water-based photoresist developer/electronics cleaning compositions manifesting reduced equilibrium and dynamic surface tension by the incorporation as surfactant of an effective amount of certain cyclic urea compounds of the structure

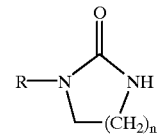

where R is a C6 to C12 alkyl group or R"O—(CH$_2$)$_m$—, R" is a C4 to C12 alkyl group, m is 2–4 and n is 1 or 2.

20 Claims, No Drawings

CYCLIC UREAS IN PHOTORESIST DEVELOPERS

CROSS-REFERENCE TO RELATED APPLICATIONS

This application is a continuation-in-part of application Ser. No. 09/337,053 filed Jun. 21, 1999, which is a divisional application of U.S. Pat. No. 5,972,431 which is hereby incorporated by reference.

FIELD OF THE INVENTION

The invention relates to the use of cyclic ureas as wetting agents in aqueous photoresist developer and electronics cleaning compositions.

BACKGROUND OF THE INVENTION

The demands of semiconductor manufacture have required the use of high performance surfactants and wetting agents in photoresist developer formulations. As line features shrink to smaller sizes and photoresist substrate materials become more aliphatic in nature (i.e. having lower surface energy), aqueous developer solutions are being formulated with surface tension reducing agents. Another requirement for these developers is that they have a low tendency to foam. This is accentuated by the movement toward larger wafer sizes. Low foam formation is particularly important when using spray-puddle techniques because microbubble entrainment during spreading of the solution over the photoresist surface can lead to defects. Surfactants that have been used in the past to increase wetting of the photoresist typically lead to higher foam formation. For the most part the industry has focused on the effect of surfactant on photoresist performance, such as contrast, critical dimension, and feature sharpness. Although the cleaning ability of underlying substrates is enhanced by typical surfactants, foam formation still remains a problem.

Tetramethylammonium hydroxide (TMAH) is the chemical of choice in aqueous alkaline solutions for developing photoresists according to *Microlithography, Science and Technology*, edited by J. R. Sheats and B. W. Smith, Marcel Dekker, Inc., 1998, pp 551–553. Surfactants are added to the aqueous TMAH solutions to reduce development time and scumming and to improve surface wetting.

U.S. Pat. No. 5,985,968 discloses the use of 1,1-dialkyl ureas to reduce equilibrium and dynamic surface tension in aqueous compositions.

U.S. Pat. No. 5,972,431 discloses the use of certain cyclic ureas to reduce equilibrium and dynamic surface tension in aqueous compositions.

There are few references describing low foam surfactants in photoresist developer compositions. JP 10-319606 discloses that commercially available ethylene oxide (EO)/propylene oxide (PO) block polymers give good wetting and low foam.

JP 03-062034 discloses polyoxyalkylene dimethyl polysiloxanes as good surfactants with low foam in photoresist developer formulations. Polysiloxanes are known to rearrange or decompose under conditions of high pH.

Although there are a few references to the use of ureas in photoresist developer compositions, they are not related to the use as surface active agents.

U.S. Pat. No. 4,997,748 discloses cyclic nitrogen compounds at levels of 0.1 to 10 wt % to decrease scum formation and enhance image sharpness during photoresist development. Among the cyclic nitrogen compounds taught is the cyclic urea 1,3-dimethyl-2-imidazolidinone. Since the nitrogen compounds are not amphipathic, it is not likely that they will lower surface tensions at low concentrations, and their utility appears to be based on properties other than surface tension reduction. 1,3-dimethyl-2-imidazolidinone is well known as a very good solvent and not as a surface-active material.

Maekawa et al, "Dissolution Inhibitory Effect of Urea Additives on a Carboxyl Polymer Through a Supramolecular Structure", disclose the use of 1,3-disubstituted ureas to modify the dissolution characteristics of photosensitive carboxyl-polymers in TMAH solution. The amounts of the ureas were not specified, but it is clear that their role is to actively bind to the resin and not to lower the surface tension of the developer.

SUMMARY OF THE INVENTION

This invention provides water-based photoresist developing, or electronics cleaning, compositions having reduced equilibrium and dynamic surface tension by incorporation of an effective amount of certain cyclic urea compounds of the structure

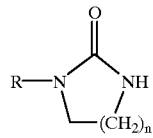

where R is a C6 to C12 alkyl group or R"O—(CH$_2$)$_m$—, R" is a C4 to C12 alkyl group, m is 2–4 and n is 1 or 2.

By "water-based", "aqueous" or "aqueous medium" we mean, for purposes of this invention, a solvent or liquid dispersing medium which comprises at least about 90 wt %, preferably at least about 95 wt %, water. Obviously, an all water medium is also included. Also for purposes of the present invention, the terms "photoresist developing" and "electronics cleaning" are interchangeable.

Also provided is a method for developing a photoresist after exposure to radiation by applying to the photoresist surface a water-based developer composition containing an effective amount of a cyclic urea compound of the above structure for reducing the dynamic surface tension of the composition.

There are significant advantages associated with the use of these cyclic urea compounds in water-based photoresist developer, or electronics cleaning, compositions and these advantages include:

an ability to control the foaming characteristics of the water-based compositions; and an ability to formulate low surface tension aqueous electronics cleaning and processing solutions, including photoresist developer solutions, for the semiconductor manufacturing industry with good wetting and extremely low foam.

The use of these materials in photoresist developer formulations is of particular importance because of their ability to provide all the advantages of surface tension lowering plus outstanding performance in reducing the formation of foam and doing so while maintaining good contrast for photoresist developing applications.

DETAILED DESCRIPTION OF THE INVENTION

This invention relates to the use of compounds of the formula

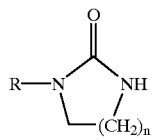

where R is a C6 to C12 alkyl group or $R''O$—$(CH_2)_m$—, $R''$ is a C4 to C12 alkyl group, m is 2–4 and n is 1 or 2 for the reduction of equilibrium and dynamic surface tension and low foaming in water-based photoresist developer formulations. It is desirable that an aqueous solution of the cyclic urea demonstrates a dynamic surface tension of less than 45 dynes/cm at a concentration of $\leq 5$ wt % in water at 23° C. and 1 bubble/second according to the maximum-bubble-pressure method. The maximum-bubble-pressure method of measuring surface tension is described in *Langmuir* 1986, 2, 428–432, which is incorporated by reference.

The cyclic ureas suitable for use in the present invention are those taught in U.S. Pat. No. 5,972,431, which patent also teaches how to make these cyclic ureas.

Generally, in the practice of this invention, it is desirable to choose alkyl groups such that the resulting cyclic ureas have a solubility in water of at least 0.001 wt %, preferably from 0.001 to 1 wt %, and most preferably from 0.05 to 0.5 wt %.

The alkyl group R may be a linear, branched, or cyclic C6 to C12 hydrocarbon moiety. In general, lower numbers of alkyl carbon or a higher degree of branching will increase the solubility of the surfactant but decrease the efficiency (i.e. a greater amount will be required to obtain a given reduction in surface tension). Examples of suitable alkyl groups include 1-hexyl, 2-hexyl, 3-hexyl, cyclohexyl, 1-octyl, 2-ethylhexyl, 2-octyl, 3-octyl, isooctyl, cyclooctyl, n-nonyl, 2-nonyl, 3-nonyl, 4-nonyl, isononyl, n-decyl, isodecyl, 2-decyl, 3-decyl, n-dodecyl, cyclododecyl, and the like. Of course, this list is not comprehensive, and the particular alkyl group chosen for a particular use will depend on the performance characteristics required for that application. Derivatives in which the alkyl group is a mixture of isomers are also suitable for the practice of this invention. C7 to C10 hydrocarbon derivatives are preferred and C8 hydrocarbon derivatives are especially preferred.

Compounds in which the higher alkyl group contains ether linkages, i.e., $R''O$—$(CH_2)_m$—, where $R''$ is a C4 to C12 alkyl group, m is 2–4 and n is 1 or 2, are also suitable for use in this invention. Examples of suitable C4 to C12 alkyl groups include 1-butyl, 2-butyl, t-butyl, 1-pentyl, 2-pentyl, 3-pentyl, neopentyl, 1-hexyl, 2-hexyl, 3-hexyl, cyclohexyl, 1-octyl, 2-ethylhexyl, 2-octyl, 3-octyl, isooctyl, cyclooctyl, n-nonyl, 2-nonyl, 3-nonyl, 4-nonyl, isononyl, n-decyl, isodecyl, 2-decyl, 3-decyl, n-dodecyl, cyclododecyl, and the like. Derivatives in which $R''$ is C6 to C10 alkyl and m is 3 are preferred, although the particular choice will depend on the properties required for a specific application.

An amount of the cyclic urea compound that is effective to reduce the equilibrium and/or dynamic surface tension of the water-based photoresist developer/electronics cleaning composition is added. Such effective amount may range from 0.001 to 1 g/100 m/l, preferably 0.005 to 0.5 g/100 ml, of the aqueous composition. Naturally, the most effective amount will depend on the particular application and the solubility of the cyclic urea.

The use of the cyclic urea as a surfactant is particularly advantageous in the developers for photoresists that are employed in the semiconductor industry. Such developers and their use are well known in the art and do not need to be described in detail. The improvement provided by this invention, which could not have been foreseen, involves the use in these developer formulations of certain alkyl cyclic ureas containing 6 to 12 carbon atoms in the alkyl groups and certain alkylether cyclic ureas containing 6 to 16 carbon atoms in the alkylether moiety.

In the following water-based photoresist developer, or electronic cleaning, composition containing a cyclic urea according to the invention, other optional components of such compositions are those materials well known to the workers in the art. A typical water-based photoresist developer, or electronic cleaning, composition to which the cyclic ureas may be added would comprise an aqueous medium containing the following components:

| Water-Based Photoresist Developer Composition | |
|---|---|
| 0.1 to 3 wt % | Tetramethylammonium Hydroxide |
| 0 to 4 wt % | Phenolic Compound |
| 10 to 10,000 ppm | Cyclic Urea |

Briefly, the process for manufacture of integrated circuits involves the application of a film of photoresist composition to a suitable substrate, such as a silicon wafer, which is then exposed to actinic radiation in a design pattern that is imposed upon the photoresist film. Depending upon whether the photoresist is positive or negative-working, the radiation either increases or decreases its solubility in a subsequently applied developer solution. Consequently, in a positive-working photoresist the areas masked from the radiation remain after development while the exposed areas are dissolved away. In the negative-working photoresist the opposite occurs. The surfactant of this invention can be used in developers for either type of photoresist. The character of the developer is very important in determining the quality of the circuits formed and precise control of developing is essential. To achieve better surface wetting by the developer it has been common to add surfactant to the formulation in order to reduce surface tension of the solution. This addition, however, can cause the developer to foam which leads to circuit defects. This foaming problem is also recognized in the art and considerable attention in the industry has been directed toward its solution.

The aqueous developer, or electronics cleaning, solutions in which use of the cyclic ureas is preferred are the aqueous solutions of tetramethylammonium hydroxide (TMAH). These developers are also well known in the art. Commercial developers usually contain low levels of surfactant on the order of 50 to 1000 ppm by weight. Surfactant level should not exceed that required to achieve the desired surface tension of the solution. For example, surface tensions of about 40 to 45 dynes/cm would be appropriate for novolac-based photoresist resins. Advanced resins that often incorporate aliphatic groups might require a developer with lower surface tension to enhance wetting. One of the advantages of the surfactants of this invention is that suitable surface tensions can be obtained at lower levels than is required by other wetting agents. This in itself is a step toward solving the foaming problem in the manufacture of microcircuitry.

The disclosure of U.S. Pat. No. 5,972,431, which patent relates to the use of cyclic ureas as surfactants in aqueous compositions, is hereby incorporated by reference.

EXAMPLE 1

This example illustrates the preparation of n-octylimidazolidone.

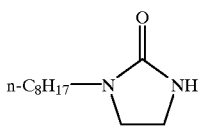

The starting diamine, N-n-octyl ethylene diamine was prepared from n-octyl chloride and ethylene diamine (Linsker and Evans, *J. Am. Chem. Soc.* 1945, 67, 1581–1582). This diamine (9.95 g, 0.058 mol) was reacted with urea (3.5 g, 0.058 mol) in a 50 mL 3-neck round bottom flask. The flask was equipped with a nitrogen inlet to flush the ammonia produced in the reaction out of the system and into a trap (dilute sulfuric acid). Ammonia evolution commenced at about 140° C. and heating was continued to 210° C. The temperature was held at this level for two hours to assure ring closure to the cyclic product. A small amount of material was sublimed from the reaction residue to give a white crystalline solid (mp 42.0–42.4° C.) which was used for all further measurements.

EXAMPLE 2

This example illustrates the preparation of n-octyl tetrahydropyrimidone (N-n-octylpropylene urea).

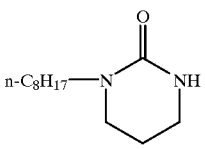

The starting diamine was prepared from n-octyl chloride and 1,3-propane diamine in a similar fashion to the ethylene diamine derivative of Example 1. It can also be synthesized by aminopropylation of n-octyl amine (Tarbell et al *J. Am. Chem. Soc.* 1946, 68, 1217–1219). Reaction with urea was performed as in Example 1 to give 91% yield of the product (mp 68–72° C., single peak by GC, no extraneous peaks by $^{13}$C NMR).

Other urea compounds for use in this invention which can be prepared similarly include 2-ethylhexyltetrahydropyrimidone and isodecyloxypropyltetrahydropyrimidone.

EXAMPLE 3

(a) A commercial photoresist based on a novolac-type cresol/formaldehyde resin and a diazonaphthoquinone (DNQ) photosensitive agent (SPR510A, Shipley) is coated on a 4 inch silicon wafer to a thickness of approximately 1 micron following the manufacturer's instructions. Different areas of the resist are then exposed to UV radiation centered at 365 nm (mercury i-line) at various levels of intensity by positioning the wafer under an aperture opening and operating a shutter. The resulting exposed wafer is developed in a puddle of 0.262 M tetramethylammonium hydroxide (TMAH) containing sufficient n-octylimidazolidone (~250 ppm) to lower the surface tension of the developer to 42 dynes/cm. The various portions of the wafer are then examined for film thickness using a Filmetrics F20 Thin-Film Measuring System (San Diego, Calif.) and the results are compared to the film thicknesses before exposure and developing. The Normalized Film Thickness is a dimensionless ratio and is calculated by dividing the pre-exposure film thickness by the post-development film thickness.

(b) Another commercially available photoresist (OCG 825 20 cS, Olin Corporation) is used to coat a 4 inch silicon wafer with a film thickness of approximately 1 micron. This resist is designed to be much more soluble in developer solutions and is used with 0.131M TMAH. Different areas of the resist are then exposed to UV radiation centered at 365 nm (mercury i-line) at various levels of intensity by positioning the wafer under an aperture opening and operating a shutter. The exposed resist is developed with 0.131 M TMAH containing ~250 ppm n-octyl tetrahydropyrimidone (N-n-octylpropylene urea). Again, outstanding selectivity is obtained, even with this highly sensitive photoresist formulation.

(c) Similarly, 2-ethylhexyltetrahydropyrimidone (~250 ppm) is used to formulate a 0.262N solution of TMAH to a surface tension of about 42 dynes/cm. Good dissolution behavior is observed using SPR 510A photoresist.

EXAMPLE 4

Foam tests are made with a TMAH developer solution formulated with n-octyl-imidazolidone as surfactant and with two commercial developer solutions containing surfactants. Data are collected utilizing an apparatus based on ASTM D1173-53 and a technique generally referred to as the Ross-Miles method. The results are given in Table 1 and show that the minimal foam from the cyclic urea does not persist and dissipates much faster than that formed by commercial developer solutions.

TABLE 1

| Developer | Initial Foam ht (cm) | Time to 0 Foam or cm Foam after 5 min |
|---|---|---|
| n-Octylimidazolidone in TMAH | <3 | <30 s |
| OCG 934 3:2[a] | 2.4 | 150 s |
| MF-319[b] | 3.6 | 2.9 cm |

[a]Commercial developer solution from Olin (now Arch Chemical)
[b]Commercial developer marketed under the Microposist ® trademark by Shipley The above data in Table 1 show that TMAH developer solution containing the cyclic urea as the surfactant develop considerably less foam than the commercial developer solutions containing other types of surfactant. It is quite surprising that cyclic ureas containing 6 to 12 total carbon atoms in the alkyl groups increases the ability of these materials to reduce both surface tension and foaming tendency in TMAH developer solutions while maintaining good contrast for photoresist developing applications. These goals are achieved while lowering the level of cyclic urea required for a desired surface tension reduction.

In sum, the ability of a surfactant to reduce surface tension under both equilibrium and dynamic conditions is of great importance in the performance of waterbased photoresist developers. Low dynamic surface tension results in enhanced wetting and spreading under the dynamic conditions of application, resulting in more efficient use of the compositions and fewer defects. Foam control is a particularly important attribute in photoresist developer/electronics cleaning compositions.

STATEMENT OF INDUSTRIAL APPLICATION

The invention provides compositions suitable for use in photoresist developer/electronics cleaning compositions.

We claim:

1. In an aqueous photoresist developer composition containing a surfactant, the improvement which comprises employing as the surfactant a cyclic urea compound of the structure

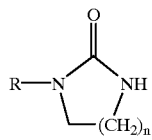

where R is a C6 to C12 alkyl group or R"O—$(CH_2)_m$—, R" is a C4 to C12 alkyl group, m is 2–4 and n is 1 or 2.

2. The developer composition of claim 1 in which an aqueous solution of the cyclic urea demonstrates a dynamic surface tension of less than 45 dynes/cm at a concentration of ≦5 wt % in water at 23° C. and 1 bubble/second according to the maximum-bubble-pressure method.

3. The developer composition of claim 1 in which R is C7–C10 alkyl.

4. The developer composition of claim 1 in which R is R"O—$(CH_2)_m$— and R" is C6 to C10 alkyl.

5. The developer composition of claim 1 in which the cyclic urea is N-n-octylimidazolidone; N-n-octyl tetrahydropyrimidone; 2-ethylhexyl-tetrahydropyrimidone; or isodecyloxypropyltetrahydropyrimidone.

6. The developer composition of claim 1 in which the cyclic urea is N-n-octylimidazolidone.

7. The developer composition of claim 1 in which the cyclic urea is N-n-octyl tetrahydropyrimidone.

8. The developer composition of claim 1 which contains tetramethylammonium hydroxide.

9. The developer composition of claim 3 which contains tetramethylammonium hydroxide.

10. The developer composition of claim 5 which contains tetramethylammonium hydroxide.

11. In a process for developing a photoresist after exposure to radiation by applying to the photoresist surface a developer solution containing a surface tension lowering amount of a surfactant, the improvement which comprises using as the surfactant a cyclic urea compound of the structure

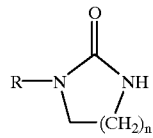

where R is a C6 to C12 alkyl group or R"O—$(CH_2)_m$—, R" is a C4 to C12 alkyl group, m is 2–4 and n is 1 or 2.

12. The process of claim 11 in which R is C7–C10 alkyl.

13. The process of claim 11 in which R is R"O—$(CH_2)_m$— and R" is C6 to C10 alkyl.

14. The process of claim 11 in which the cyclic urea is N-n-octylimidazolidone; N-n-octyl tetrahydropyrimidone; 2-ethylhexyl-tetrahydropyrimidone; or isodecyloxypropyltetrahydropyrimidone.

15. The process of claim 11 in which the cyclic urea is N-n-octylimidazolidone.

16. The process of claim 11 in which the cyclic urea is N-n-octyl tetrahydropyrimidone.

17. The process of claim 11 which the developer solution contains tetramethylammonium hydroxide.

18. The process of claim 12 in which the developer solution contains tetramethylammonium hydroxide.

19. An aqueous photoresist developer composition comprising in water the following components 0.1 to 3 wt % tetramethylammonium hydroxide, 0 to 4 wt % phenolic compound; and 10 to 10,000 ppm cyclic urea, the cyclic urea compound having the structure

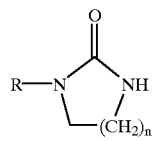

where R is a C6 to C12 alkyl group or R"O—$(CH_2)_m$—, R" is a C4 to C12 alkyl group, m is 2–4 and n is 1 or 2.

20. The aqueous developer composition of claim 19 in which the urea is N-n-octylimidazolidone or N-n-octyl tetrahydropyrimidone.

* * * * *